United States Patent
Lee

(10) Patent No.: US 7,154,784 B2
(45) Date of Patent: Dec. 26, 2006

(54) FLASH MEMORY WITH REDUCED SIZE AND METHOD FOR ACCESSING THE SAME

(75) Inventor: Sok Kyu Lee, Icheon-si (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 43 days.

(21) Appl. No.: 11/158,659

(22) Filed: Jun. 21, 2005

(65) Prior Publication Data

US 2006/0215482 A1 Sep. 28, 2006

(30) Foreign Application Priority Data

Mar. 22, 2005 (KR) .................... 10-2005-0023467

(51) Int. Cl.
*G11C 11/34* (2006.01)

(52) U.S. Cl. ............... 365/185.12; 365/185.17; 365/185.33

(58) Field of Classification Search ........... 365/235, 365/185.12, 185.33, 185.17, 185.25, 189.05
See application file for complete search history.

(56) References Cited

U.S. PATENT DOCUMENTS 5,761,132 A * 6/1998 Kim ................ 365/189.05
6,067,248 A * 5/2000 Yoo ................ 365/185.03
6,288,936 B1 * 9/2001 Kawamura ......... 365/185.03
6,556,504 B1 * 4/2003 Kwon et al. ....... 365/230.08
6,930,919 B1 * 8/2005 Lee et al. ......... 365/185.17
6,967,868 B1 * 11/2005 Kim et al. ........ 365/185.09
7,061,813 B1 * 6/2006 Lee ................ 365/189.05

FOREIGN PATENT DOCUMENTS

KR 2003-0011234 A 2/2003

* cited by examiner

*Primary Examiner*—Richard Elms
*Assistant Examiner*—Hien Nguyen
(74) *Attorney, Agent, or Firm*—Townsend and Townsend and Crew LLP

(57) ABSTRACT

A flash memory device is provided with reduced size and method of accessing the same. In the flash memory device, since memory cells are each coupled to a plurality of bitline pairs and is configured to be accessed by a single page buffer circuit and a single Y-gate circuit, it is possible to reduce the number of the Y-gate circuits and thereby to shrink down the size of the flash memory device.

21 Claims, 5 Drawing Sheets

FLASH MEMORY WITH REDUCED SIZE AND METHOD FOR ACCESSING THE SAME

CROSS-REFERENCES TO RELATED APPLICATIONS

The present application claims priority to Korean Patent Application No. 10-2005-0023467, filed Mar. 22, 2005, which is incorporated by reference.

BACKGROUND OF THE INVENTION

The present invention relates to semiconductor memory devices and specifically, to flash memory devices.

Flash memory devices operable with read, program, and erase operations usually include page buffer circuits. By the page buffer circuits, data of large volume are programmed into the flash memory device in the unit of page for a short time or read out from the flash memory device in the unit of page. FIG. 1 is a circuit diagram showing a page buffer circuit and Y-gate circuit of a conventional flash memory device. Referring to FIG. 1, the page buffer circuits P1~PK (K is an integer) are connected to pairs of bitlines BLe1/BLo1~BLeK/BLoK, each corresponding thereto. The page buffer circuits P1~PK are also connected to Y-gate circuits G1~GK (K is an integer), each corresponding thereto. Each of the page buffer circuits P1~PK includes NMOS transistors NM1~NM6, a PMOS transistor PM1, and a latch circuit LA. The NMOS transistors NM1 and NM2 are turned on or off in response each to bitline selection signals, one of BSLe~BSLeK and one of BSLo1~BSLoK. The NMOS transistors NM1 and NM2 are turned on to connect the bitlines, one of BLe1~BLeK and one of BLo1~BLoK, each to a sensing node S1~SK. The PMOS transistor PM1 is turned on or off in response to a precharge signal, one of PRCHb1~PRCHbK. The NMOS transistor NM3 is turned on or off in response to a program control signal, one of PGM1~PGMK. When the NMOS transistor NM3 is turned on, a data bit (not shown) received from the latch circuit LA is transferred to a bitline connected to the sensing node (one of S1~SK), one of BLe1~BLeK or one of BLo1~BLoK. The NMOS transistor NM4 is turned on or off in response to the sensing node, one of S1~SK, while the NMOS transistor NM5 is turned on or off in response to a latch control signal, one of LCH1~LCHK. The NMOS transistor NM6 initializes the latch circuit LA in response to a reset control signal RST. The Y-gate circuits G1~GK transfer read data, which are received from their corresponding page buffer circuits P1~PK, an input/output line IOL in response to the control signals YS1~YSK, respectively, or transfer program data (not shown) to the page buffer circuits P1~PK from the input/output line IOL, respectively.

As aforementioned, as the conventional flash memory device needs one Y-gate circuit for one pair of bitlines, an increase in the number of bitlines causes an increase in the number of Y-gate circuits. As a result, it increases the size occupied by the Y-gate circuits, enlarging the size of the flash memory device. Further, if the number of the Y-gate circuits increases, it is required for a Y-decoder to have more control signals to control operations of the increased Y-gate circuits, as well as increasing the number of lines to supply the control signals.

BRIEF SUMMARY OF THE INVENTION

The present invention is directed to flash memory devices. One embodiment of the present invention is directed to providing a flash memory device capable of reducing its whole size and the number of Y-gate circuits by accessing memory cells, which are connected to pairs of bitlines, with a single page buffer circuit and a single Y-gate circuit.

One embodiment of the present invention is also directed to provide a method of controlling a read operation in a flash memory device, capable of reducing its whole size and the number of Y-gate circuits by accessing memory cells, which are connected to pairs of bitlines, with a single page buffer circuit and a single Y-gate circuit.

One embodiment of the present invention is further directed to provide a method of controlling a program operation in a flash memory device, capable of reducing its whole size and the number of Y-gate circuits by accessing memory cells, which are connected to pairs of bitlines, with a single page buffer circuit and a single Y-gate circuit.

An aspect of the present invention is to provide a flash memory device comprising a memory cell array, page buffer circuits, Y-gate circuits, and a Y-decoder. The memory cell array includes memory cells connected to pluralities of bitlines. The page buffer circuits are correspondingly connected to bitline pairs with a predetermined number among the plural bitlines, sequentially storing sensing data bits corresponding to read data bits received through a part of the bitline pairs with the predetermined number in response to one of transfer control signals and a latch control signal during a read operation and sequentially outputting the stored data bits to one of internal input/output lines in response to one of the transfer control signals. The Y-gate circuits are correspondingly connected to the page buffers through the internal input/output lines, each connecting or disconnecting one of the internal input/output lines with a data input/output line in response to one of input/output control signals. The Y-decoder generates the transfer control signals and the input/output control signals in response to column address signals, a read command or a program command.

Another aspect of the present invention is to provide a method for controlling a read operation of a flash memory device, the method comprising the steps of: sequentially storing sensing data bits, corresponding to read data bits received through a part of bitline pairs with a predetermined number, into page buffer circuits correspondingly connected to bitlines with the predetermined number, in response to a read command; isolating internal input/output lines from data input/output lines by Y-gate circuits each connected to page buffer circuits through the internal input/output lines while storing the sensing data bits each in the page buffer circuits; connecting the internal input/output lines to the data input/output line one by one in sequence by the Y-gate circuits after storing the sensing data bits each into the page buffer circuits; and outputting the sensing data bits, which are stored in one of the page buffer circuits, in sequence to the internal input/output line connected with the data input/output line whenever the internal input/output lines are each connected to the data input/output line.

One embodiment of the present invention also provides a method for controlling a program operation of a flash memory device, the method comprising the steps of: connecting internal input/output lines to a data input/output line one by one in sequence for a predetermined time in response to a program command by Y-gate circuits connected to page buffer circuits through the internal input/output lines, each page buffer circuits connected to bitline pairs with a predetermined number; sequentially storing program data bits into one of the page buffer circuits whenever one of the internal input/output lines is connected to the data input/output line;

isolating internal input/output lines from data input/output lines by the Y-gate circuits while storing the sensing data bits in the page buffer circuits; and simultaneously outputting the program data bits, which are each stored in the page buffer circuits, to a part of the bitline pairs with the predetermined number, after the isolation.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Figure 1:
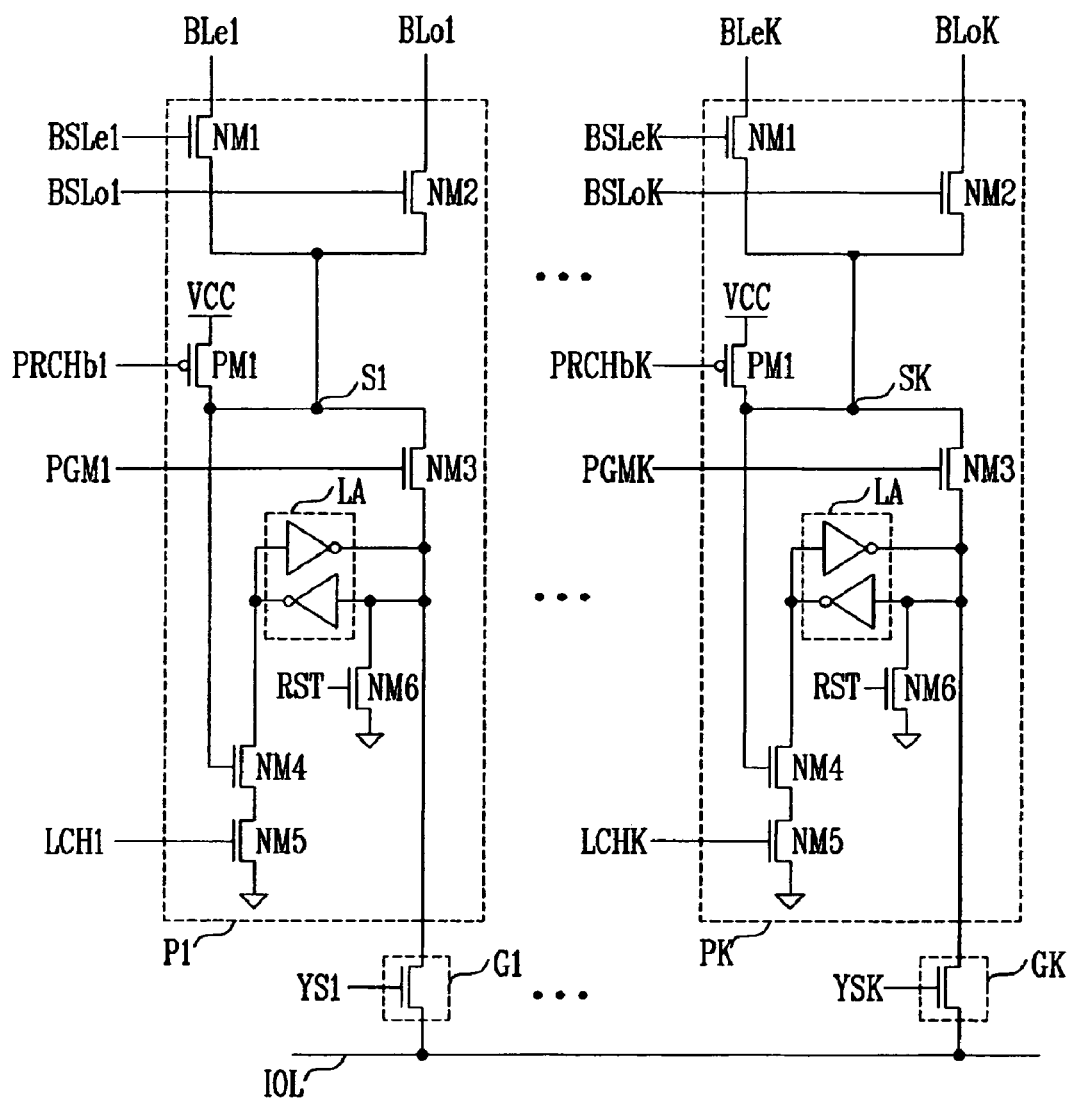
FIG. 1 is a circuit diagram showing a page buffer circuit and Y-gate circuit of a conventional flash memory device.
Figure 2:
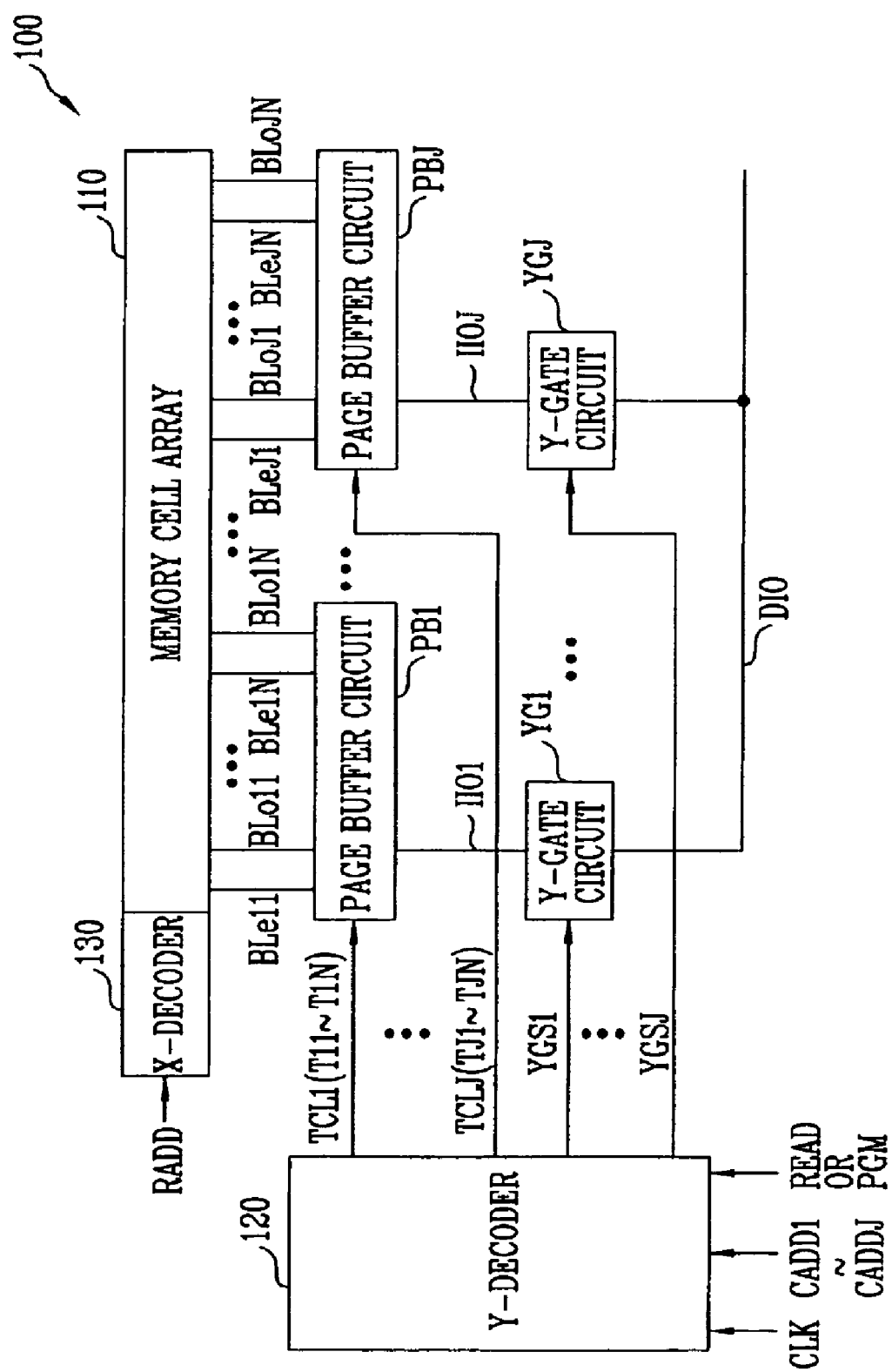
FIG. 2 is a block diagram illustrating a flash memory device in accordance with an embodiment of the present invention.

FIG. 2 is a block diagram illustrating a flash memory device in accordance with an embodiment of the present invention. Referring to FIG. 2, the flash memory device 100 is comprised of a memory cell array 110, a Y-decoder 120, an X-decoder 130, page buffer circuits PB1~PBJ (J is an integer), and Y-gate circuits YG1~YGJ. The memory cell array 110 includes memory cells (not shown) connected to pluralities of bitlines BLe11~BLeJN (J and N are integers). The Y-decoder 120 outputs transfer control signals TCL1~TCLJ (J is an integer) and input/output control signals YGS1~YGSJ (J is an integer) in response to a clock signal CLK, column address signals CADD1~CADDJ (J is an integer), and a read command READ or a program command PGM. The transfer control signals TCL1~TCLJ are each composed of bits in the predetermined number. For instance, the transfer control signal TCL1 is composed of bits T11~T1N and the transfer control signal TCLJ is composed of bits TJ1~TJN. The X-decoder 130 selects one of wordlines (not shown) connected to the memory cells of the memory cell array 110 in response to a row address signal RADD.

The page buffer circuits PB1~PBJ are each connected to bitline pairs with a predetermined number among plural bitlines BLe11~BLoJN. For example, the page buffer circuit PB1 is connected to the bitline pairs BLe11/BLo11~BLe1N/BLo1N. Further the page buffer circuits PB1~PBJ are each connected to internal input/output lines IIO1~IIOJ. The page buffer circuits PB1~PBJ are each operable in response to the transfer control signals TCL1~TCLJ. The operations of the page buffer circuits PB1~PBJ are similar to each other, so it will be described with the operation of the page buffer circuit PB1 as an example. In a read operation, the page buffer circuit PB1 sequentially stores sensing data bits (not shown), which correspond to read data bits received through a part of the bitline pairs BLe11/BLo11~BLe1N/BLo1N, one by one in response to the transfer control signal TCL1. And, the page buffer circuit PB1 sequentially outputs the stored data bits to the internal input/output line IIO1 in response to the transfer control signal TCL1. In a program operation, the page buffer circuit PB1 sequentially stores program data bits, which are received through the internal input/output line IIO1, in response to the transfer control signal TCL1, and simultaneously outputs the stored data bits to a part of the bitline pairs BLe11/BLo11~BLe1N/BLo1N.

The Y-gate circuits YG1~YGJ are correspondingly connected each to the page buffer circuits PB1~PBJ through internal input/output lines IIO1~IIOJ. The Y-gate circuits YG1~YGJ are also connected to a data input/output line DIO. The Y-gate circuits YG1~YGJ connect or disconnect a corresponding one of the internal input/output lines IIO1~IIOJ to the data input/output line DIO in response to one of input/output control signals YGS1~YGSJ. Here, when one of the input/output control signals YGS1~YGSJ is enabled, since the other input/output control signals are disabled, one of the Y-gate circuits YG1~YGJ connects one of the internal input/output lines IIO1~IIOJ to the data input/output line DIO. For instance, in the read operation, when the Y-gate circuit YG1 connects the internal input/output line IIO1 to the data input/output line DIO, the Y-gate circuits YG2~YGJ isolate the internal input/output lines IIO2~IIOJ from the data input/output line DIO. As a result, the sensing data bits stored in the page buffer circuit PB1 are transferred to an input/output circuit (not shown) through the internal input/output line IIO1 and the data input/output line DIO in sequence. And, in the program operation, when the Y-gate circuit YG1 connects the internal input/output line IIO1 to the data input/output line DIO, the program data bits are sequentially transferred to the page buffer circuit PB1 from the input/output circuit through the data input/output line DIO and the internal input/output line IIO1.

Next, it will be described about the detailed structures and operations of the page buffer circuits PB1~PBJ and Y-gate circuits YG1~YGJ. As the structures and operation of the page buffer circuits PB1~PBJ are similar to each other as well as those of the Y-gate circuits, it will be described using those of the page buffer circuit PB1 and Y-gate circuit as an example.

The page buffer circuit PB1 is comprised of bitline selection circuits BS1~BSN (N is an integer), a precharge circuit P1, a first switches FW1~FWN, a sensing circuit 140, latch circuits LA1~LAN, pass circuits PA1~PAN, and second switches SW1~SWN. The bitline selection circuits BS1~BSN are each connected between the bitline pairs and one of first sensing nodes FS1~FSN. Each of the bitline selection circuits BS1~BSN includes two NMOS transistors N1 and N2.

The number of the bitline selection circuits included in the page buffer circuit PB1 may be established using the same number of bitline pairs connected to the page buffer circuit PB1. For example, when four bitline pairs are connected to the page buffer circuit PB1, the page buffer circuit PB1 may include four bitline selection circuits. The numbers of the first switches, the latch circuits, the pass circuits, and the second switches may be each established with the same number of the bitline selection circuits.

Each of the bitline selection circuits BS1~BSN connect one of the bitline pairs to a corresponding one of the first sensing nodes FS1~FSN in response to each of the bitline selection signals BSLe11/BSLo11~BSLe1N/BSL1N. In more detail, sources of the NMOS transistors N1s of the bitline selection circuits BS1~BSN are connected each to the bitlines BLe11~BLe1N, and drains thereof are connected each to the first sensing nodes FS1~FSN. And, the bitline selection signals BSLe11~BSLe1N are each applied to gates of the NMOS transistors N1s. The NMOS transistors N1s are turned on or off in response each to the bitline selection signals BSLe11~BSLe1N. The NMOS transistors N1s are turned on to connect the bitlines BLe11~BLe1N with the first sensing nodes FS1~FSN.

And, sources of the NMOS transistors N2s of the bitline selection circuits BS1~BSN are connected each to the bitlines BLo11~BLo1N, and drains thereof are connected each to the first sensing nodes FS1~FSN. And, the bitline selection signals BSLo11~BSLo1N are each applied to gates of the NMOS transistors N2s. The NMOS transistors N2s are turned on or off in response each to the bitline selection signals BSLo11~BSLo1N. The NMOS transistors N2s are turned on to connect the bitlines BLo111~BLo1N with the first sensing nodes FS1~FSN.

The precharge circuit P1 precharges the second sensing node SS0 to a predetermined voltage level in response to the precharge control signal PRCHb. Preferably, the precharge circuit P1 may be implemented by a PMOS transistor. When the precharge control signal PRCHb is disabled, the precharge circuit P1 precharges the second sensing node SS0 to a level of a power source voltage VCC.

The switches FW1~FWN are each connected between the first sensing nodes FS1~FSN and the second sensing node SS0, simultaneously connecting or disconnecting the first sensing nodes FS1~FSN with the second sensing node SS0. Preferably, the first switches FW1~FWN may be implemented by NMOS transistors. Thus, when the read control signal RCTL is enabled, the first switches FW1~FWN connect the first sensing nodes FS1~FSN to the second sensing node SS0 at the same time.

The sensing circuit 140 may be implemented by NMOS transistors N3 and N4. The NMOS transistor N3 is coupled to the second sensing node SS0 with its gate and connected to the latch circuit LA1 with its drain. The NMOS transistor N3 is turned on or off in accordance with a voltage level of the second sensing node SS0. The gate of the NMOS transistor N4 is supplied with a latch control signal LCH, the drain thereof is connected to the source of the NMOS transistor N3 and the source thereof is supplied with a ground voltage VSS. The NMOS transistor N4 is turned on or off in response to the latch control signal LCH. The sensing circuit 140 is enabled in response to the latch control signal LCH, sensing read data bits sequentially transferred to the second sensing node SS0 from a part of the bitlines BLe11~BLo1N and then generating sensing data bits SQ1b~SQNb in sequence.

The latch circuits LA1~LAN may be implemented by two inverters I1 and I2, in which an input of the inverter I1 is connected to an output of the inverter I2 and an input of the inverter I2 is connected to an output of the inverter I1. The latch circuits LA1~LAN latch the sensing data bits SQ1b~SQNb, respectively, or latch program data bits PQ1~PQN. Further, the latch circuit LA1 sequentially latches and outputs the sensing data bits SQ1b~SQNb that are sequentially received from the sensing circuit 140 during the read operation. And, the latch circuit LA1 is further connected to a reset circuit N5. The reset circuit N5 initializes the latch circuit LA1 in response to a reset control signal RST.

The pass circuits PA1~PAN share the internal input/output line II01 and each connected to the latch circuits LA1~LAN. The pass circuits PA1~PAN may be implemented by NMOS transistors. The pass circuits PA1~PAN each connect or disconnect the latch circuits LA1~LAN with the internal input/output line II01 in response to the bits T11~T1N of the transfer control signal TCL1. Preferably, when the bits T11~T1N are each in logic '1', the pass circuits PA1~PAN each connect the latch circuits LA1~LAN to the internal input/output line II01.

The second switches SW1~SWN are each connected between the latch circuits LA1~LAN and the sensing nodes FS1~FSN. The second switches SW1~SWN connect or disconnect the latch circuits LA1~LAN to the first sensing nodes FS1~FSN at the same time in response to a program control signal PCT1. The Y-gate circuit YG1 may be implemented by an NMOS transistor, being connected between the internal input/output line II01 and the data input/output line DIO. The Y-gate circuit YG1 connects or disconnects the internal input/output line II01 with the data input/output line DIO in response to an input/output control signal YGS1. Preferably, when the input/output control signal YGS1 is enabled, the Y-gate circuit YG1 connects the internal input/output line II01 to the data input/output line DIO.

Figure 4:
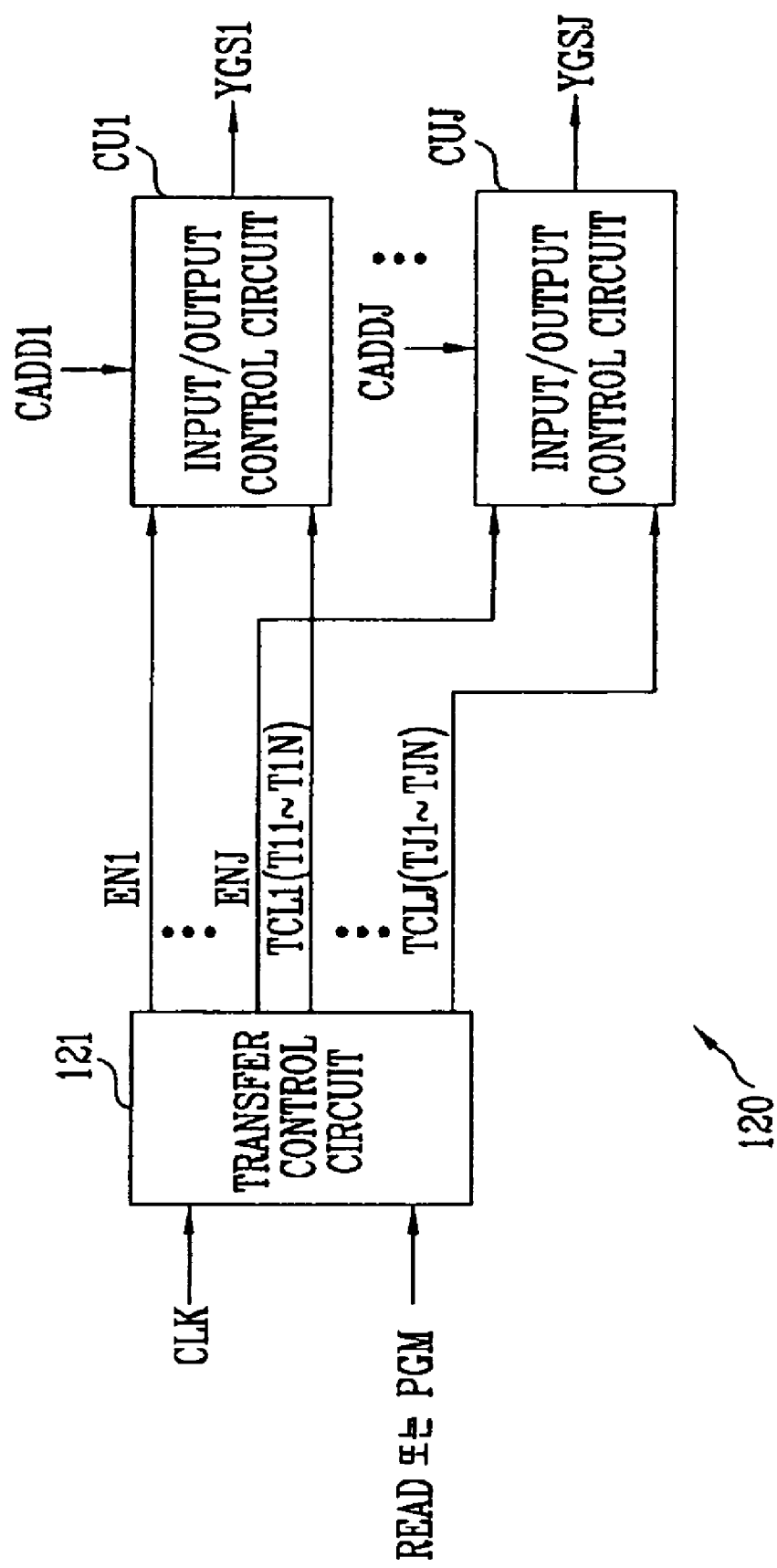
FIG. 4 is a block diagram illustrating the Y-decoder shown in FIG. 2 in detail.

FIG. 4 is a block diagram illustrating the Y-decoder shown in FIG. 2 in detail. The Y-decoder 120 is comprised of a transfer control circuit 121 and input/output control circuits CU1~CUJ (J is an integer). The transfer control circuit 121 outputs transfer control signals TCL1~TCLJ and enable control signals EN1~ENJ in response to a clock signal CLK and a read command READ or a program command PGM. Preferably, each of the transfer control signals TCL1~TCLJ includes pluralities of bits. The bit number of each of the transfer control signals TCK1~TCLJ may be established in the same with the number of the pass circuits included in the page buffer circuit. The transfer control circuit 121 maintains the enable control signals EN1~ENJ in an inactive state for a predetermined time in response to the read command READ, and activates the enable control signals EN1~ENJ one by one in sequence after the predetermined time. When one of the enable control signals EN1~ENJ is enabled, the rest enable control signals are maintained all in an inactive state.

Further, the transfer control circuit 121 activates the enable control signals EN1~ENJ one by one in sequence for another predetermine command PGM. When one of the enable control signals EN1~ENJ is enabled, the rest enable control signals are maintained all in an inactive state. After said another predetermined time, the transfer control circuit 121 maintains the enable control signals EN1~ENL all in an inactive state.

The input/output control circuits CU1~CUJ are enabled or disabled in response to the enable control signals EN1~ENJ. The input/output enable control circuits CU1~CUJ are enabled each to output the input/output control signals YGS1~YGSJ in response to the transfer control signals TCL1~TCLJ and the column address signals CADD1~CADDJ. For example, when the input/output control circuit CU1 is enabled in response to the enable control signal EN1, it outputs the input/output control signal YGS1 in response to the transfer control signal TCL1 and the column address signal CADD1.

Figure 5:
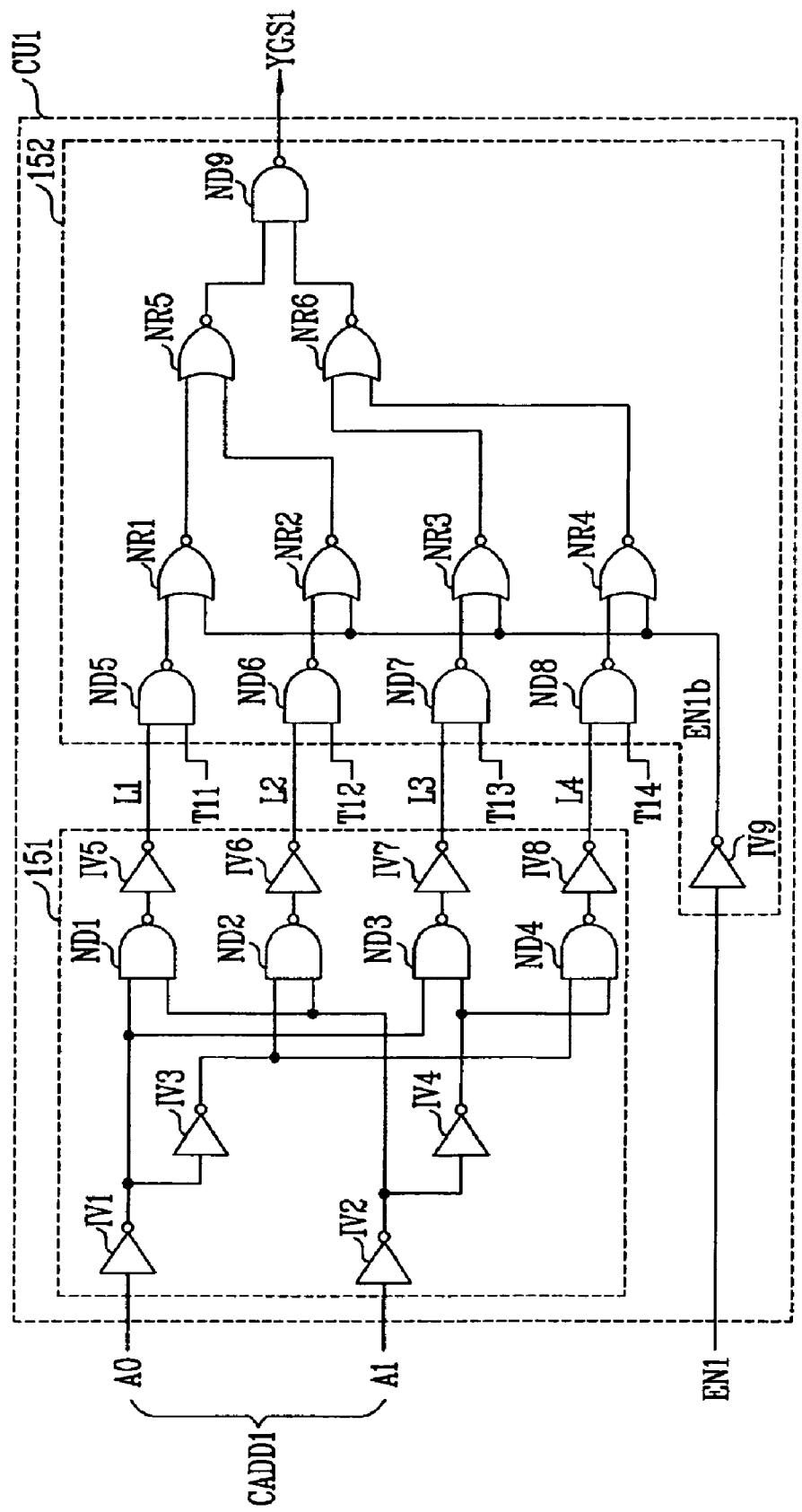
FIG. 5 is a circuit diagram illustrating an input/output control circuit shown in FIG. 4.

The structures and operations of the input/output control circuits CU1~CUJ will be described with reference to FIG. 5 in more detail. As the structures and operations of the input/output control circuits CU1~CUJ are similar to each other, it will be described with just the input/output control circuit CU1 as an example, also with the case that the transfer control signal TCL1 generated from the transfer control circuit 121 includes the plural bits T11~T14. Referring to FIG. 5, the input/output control circuit CU1 is comprised of a first logic circuit 151 and a second logic circuit 152. The first logic circuit 151 includes inverters IV1~IV8 and NAND gates ND1~ND4. The first logic circuit 151 outputs logic signals L1~L4 in response to bits A0 and A1 of the column address signal CADD1. In more detail, the inverters IV1 and IV2 inverse the bits A0 and A1, respectively. The inverters IV3 and IV4 inverse output signals of the inverters IV1 and IV2. The NAND gate ND1 logically operates the output signals of the inverters IV1 and IV2, and then outputs the operation result. The NAND gate ND2 logically operates output signals of the inverters IV3 and IV2, and then outputs the operation result. The NAND gate ND3 logically operates output signals of the inverters IV1 and IV24 and then outputs the operation result. The NAND gate ND4 logically operates the output signals of the inverters IV3 and IV4, and then outputs the operation result. The inverters IV5~IV8 each inverse output signals of the NAND gates ND1~ND4, and each output the inverse signals as the logic signals L1~L4. During this, whenever the bits A0 and A1 toggle, one of the logic signals L1~L4 becomes logic '1' while the rest logic signals become all logic '0'.

The second logic circuit 152 includes an inverter IV9, NAND gates ND5~ND9, and NOR gates NR1~NR6. The first logic circuit 152 outputs the input/output control signal YGS1 in response to the logic signals L1~L4, the bits T11~T14 of the transfer control signal TCL1, and the enable control signal EN1. In more detail, the inverter IV9 inverses the enable control signal EN1, and then outputs the inverse signal EN1b. The NAND gates ND5~ND8 each operate the logic signals L1~L4 and the bits T11~T14, and each then output the operation results. For example, the NAND gate ND5 logically operates the logic signal L1 and the bit T11, and then outputs the operation result. The NOR gates NR1~NR4 each operate the inverse signal EN1b and output signals of the NAND gates ND4~ND8, and then outputs the operation results. For example, the NOR gate NR1 logically operates the output signal of the NAND gate ND5 and the inverse signal EN1b, and then outputs the operation result.

And, the NOR gate NR5 logically operates the output signals of the NOR gates NR1 and NR2, and then outputs the operation result. The NOR gate NR6 logically operates the output signals of the NOR gates NR3 and NR4, and then outputs the operation result. The NAND gate ND9 logically operates the output signals of the NOR gates NR5 and NR6, and then outputs the operation result as the input/output control signal YGS1. Preferably, the second logic circuit 152 enables the input/output control signal YGS1 when one of the logic signals L1~L4 becomes logic '1' and one of the bits T11~T14 becomes logic '1'. As aforementioned, as the plural bitline pairs are connected to a single page buffer and Y-gate circuit, the number of the Y-gate circuits decreases to reduce the size of the flash memory device 100.

Next, referring to FIGS. 2 through 5, it will be described about read and program operations in the flash memory device 100 as configured as aforementioned. In convenience of description, it is assumed that each of the transfer control signals TCL1~TCLJ is composed of 4 bits and each of the page buffer circuits PB1~PBJ is connected to 4 bitline pairs.

As the operations of the page buffer circuits PB1~PBJ are similar to each other, it will be described with just the operation of the page buffer circuit PB1 as an example.

Figure 3:
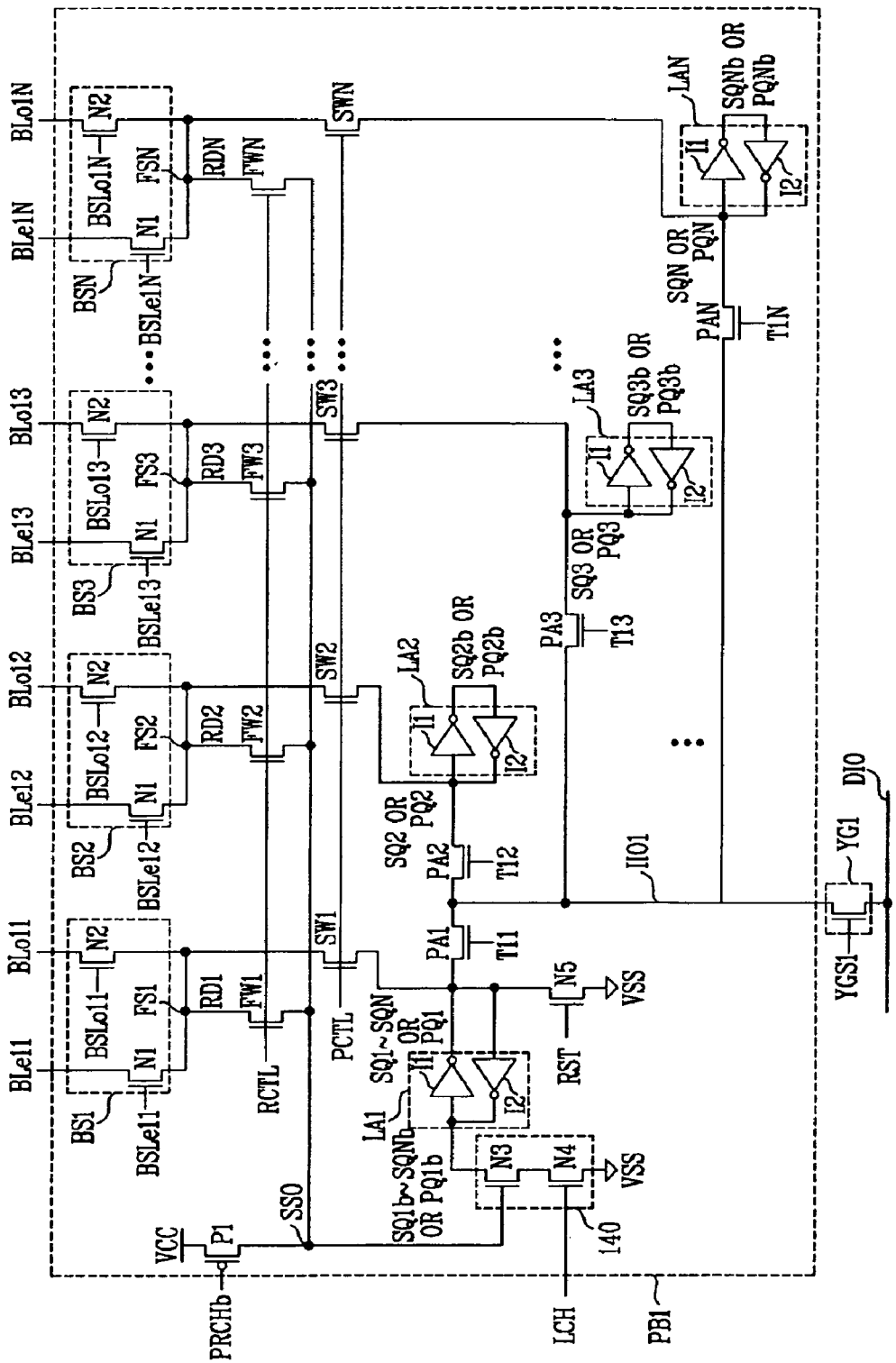
FIG. 3 is a circuit diagram illustrating page buffer and Y-gate circuits shown in FIG. 2 in detail.

First, the read operation of the flash memory device 100 is as follows. Referring to FIG. 3, in the read operation, a read control signal RCTL is enabled while a program control signal PCTL is disabled. As a result, the first switches FW1~FW4 are turned on in response to the read control signal RCTL and the first sensing nodes FS1~FS4 are simultaneously connected to the second sensing node SS0. The second switches SW1~SW4 are turned off in response to the program control signal PCTL, separating the latch circuits LA1~LA4 from the first sensing nodes FS1~FS4.

The precharge circuit P1 precharges the second sensing node SS0 to the power source voltage VCC in response to the precharge control signal PRCHb. While this, the X-decoder 130 applies a bias voltage to one of the wordlines (not shown) of the memory cell array 110. After then, the bitline selection signals BSLe11~BSLe14 or BSLo11~BSLo14 are enabled one by one in sequence. When one of the bitline selection signals BSLe11~BSLe14 is enabled, the remaining bitline selection signals are all disabled. As similar, when one of the bitline selection signals BSLo11~BSLo14 is enabled, the remaining bitline selection signals are all disabled.

For example, when the bitline selection signals BSLe11~BSLe14 are enabled one by one in sequence, the NMOS transistors N1s of the bitline selection circuits BS1~BS4 are also turned on one by one in sequence to connect the bitlines BLe11~BLe14 with the first sensing nodes FS1~FS4 in sequence. In more detail, the bitline selection signals BSLe11~BSLe14 are enabled one by one in the sequence of BSLe14->BSLe13->BSLe12->BLSe11. Thus, when the bitline BLe14 is connected to the first sensing node FS4 and then isolated therefrom again, the bitline BLe13 is connected to the first sensing node FS3. And, when the bitline BLe13 is isolated from the first sensing node FS3, the bitline BLe12 is connected to the first sensing node FS2. Thereafter, when the bitline BLe12 is isolated from the first sensing node FS2, the bitline BLe11 is connected to the first sensing node FS1.

As a result, read data bits RD1~RD4 are transferred from the bitlines BLe11~BLe14 to the second sensing node SS0 each through the first switches FW1~FW4 in the sequence of RD4, RD3, RD2, and RD1. During this, if the latch control signal LCH is enabled, the sensing circuit 140 is enabled in response to the latch control signal LCH. The sensing circuit 140 senses a voltage of the second sensing node SS0 that continuously varies by the read data bits RD4, RD3, RD2, and RD1, and sequentially generates its sensing data bits SQ4b, SQ3b, SQ2b, and SQ1b in this order.

Meanwhile, the transfer control circuit 121 of the Y-decoder 120 maintains the enable control signal EN1 in an inactive state for a first predetermined time in response to the read command READ. Here, the first predetermined time is the time for completely storing the sensing data bits SQ1b~SQ4b by the page buffer circuit PB1. Thus, the input/output control circuit CU1 of the Y-decoder 120 are disabled for the first predetermined time, maintaining the input/output control signal TGS1 in an inactive state. As a result, the Y-gate circuit YG1 isolates the internal input/output line II01 from the data input/output line DIO for the first predetermined time.

And, the transfer control circuit 121 maintains a logic value of the bit T11 of the transfer control signal TCL1 in logic '1' for a second predetermined time, and changes logic values of the bits T14, T13, and T12 into logic '1' one by one in sequence for a third predetermined time. In other words, when one of the bits T11~T14 becomes logic '1', the remaining bits become logic '0'. Here, the second predetermined time is the time for completely storing the sensing data bits SQ2b~SQ4b by the page buffer circuit PB1. The transfer control circuit 121 is able to identify each of the first through third predetermined times in accordance with the number of cycles of the clock signal CLK.

Responding to the first bit T11, the pass circuit PA1 connects the latch circuit LA1 to the internal input/output line IIO1 for the second predetermined time. The latch circuit LA1 latches the sensing data bits SQ4b, SQ3b, and SQ2b in sequence, and outputs the latched data bits SQ4, SQ3, and SQ2 in sequence. The latched data bits SQ4, SQ3, and SQ2 are transferred to the internal input/output line IIO1 in sequence by the pass circuit PA1. As a logic value of the bit T14 is '1' when the latch circuit LA1 outputs the latched data bit SQ4 to the internal input/output line IIO1, the pass circuit PA4 connects the latch circuits LA4 to the internal input/output line IIO1 for the third predetermined time in response to the bit T14. The latch circuit LA4 latches the latched data bit SQ4 that is received through the internal input/output line IIO1. After then, the pass circuits PA3 and PA2 and the latch circuits LA3 and LA2 operate as similar to the pass circuit PA4 and the latch circuit LA4. As a result, the latch circuit LA3 latches the latched data bit SQ3 and the latch circuit LA2 latches the latched data bit SQ2. Further, when the latch circuit LA1 latches the last sensing data bit SQ1b, the transfer control circuit 121 maintains logic values of the bits T11~T14 all in logic '0'. As a result, the pass circuits PA1~PA4 isolate the latch circuits LA1~LA4 from the internal input/output line IIO1.

After then, the transfer control circuit 121 enables the enable control signal EN1, and changes logic values of the bits T11~T14 to '1' in sequence for the third predetermined time. As a result, the latch circuits LA1~LA4 are connected to the internal input/output line IIO1 one by one in sequence by the pass circuits PA1~PA4. Thus, the latch circuits LA1~LA4 output the latched data bits SQ1~SQ4 to the internal input/output line IIO1 one by one in sequence. Meanwhile, as the enable control signal EN1 is activated, the input/output control circuit CU1 is enabled in response to the enable control signal EN1. The input/output control circuit CU1 outputs the input/output control signal YGS1 in response to the bits A0 and A1 of the column address signal CADD1 and the bits T11~T14. During this, whenever one of the bits T11~T14 is changed to logic '1', the input/output control circuit CU1 enables the input/output control signal YGS1. As a result, while the latched data bits SQ1~SQ4 are being transferred to the internal input/output line IIO1 one by one in sequence, the Y-gate circuit YG1 connects the internal input/output line IIO1 to the data input/output line DIO in response to the input/output control signal YGS1. Thus, the latched data bits SQ1~SQ4 are transferred to the data input/output line DIO.

Next, the program operation of the flash memory device 100 is as follows. Referring to FIG. 3, in the program operation, the read control signal RCTL and the latch control signal LCH are disabled. Thereby, the switches FW1~FW4 are turned off in response to the read control signal RCTL, isolating the first sensing nodes FS1~FS4 from the second sensing node SS0 at the same time. And, the sensing circuit 140 is disabled in response to the latch control signal LCH.

Further, the transfer control circuit 121 activates the enable control signal EN1, and changes logic values of the bits T11~T14 into '1' in sequence for the third predetermined time. As a result, the pass circuits PA1~PA4 connect the latch circuits LA1~LA4 to the internal input/output line IIO1 one by one in sequence.

Meanwhile, as the enable control signal EN1 is activated, the input/output control circuit CU1 is enabled. The input/output control circuit CU1 outputs the input/output control signal YGS1 in response to the bits A0 and A1 and the bits T11~T14. While this, whenever one of the bits T11~T14 is changed into logic '1', the input/output control circuit CU1 enables the input/output control signal YGS1. Responding to the input/output control signal YGS1, the Y-gate circuit YG1 connects the internal input/output line IIO1 to the data input/output line DIO. As a result, the program data bits PQ1~PQ4 sequentially input to the data input/output line DIO are sequentially transferred to the internal input/output line IIO1 through the Y-gate circuit YG1.

When the latch circuits LA1~LA4 are connected to the internal input/output line IIO1 in sequence by the pass circuits PA1~PA4, the latch circuits LA1~LA4 each latch the program data bits PQ1~PQ4 that are received through the internal input/output line IIO1. In other words, the latch circuit LA1 latches the program data bits PQ1 and the latch circuit LA2 latches the program data bit PQ2. The latch circuit LA3 latches the program data bits PQ3 and the latch circuit LA4 latches the program data bit PQ4.

After then, the transfer control circuit 121 maintains the enable control signal EN1 in an inactive state, and maintains logic values of the bits T11~T14 all in '0'. As a result, the input/output control circuit CU1 disables the input/output control signal YGS1, and the Y-gate circuit YG1 isolates the internal input/output line IIO1 from the data input/output line DIO in response to the input/output control signal YGS1. The pass circuits PA1~PA4 isolates the latch circuits LA1~LA4 each from the internal input/output line IIO1 in response each to the bits T11~T14.

After then, if the program control signal PCTL is enabled, the second switches SW1~SW4 are turned on at the same time in response to the program control signal PCTL, connecting the latch circuits LA1~LA4 each to the first sensing nodes FS1~FS4. As a result, the program data bits PQ1~PQ4 latched in the latch circuits LA1~LA4 are transferred to the first sensing nodes FS1~FS4.

During this, the bitline selection signals BSLe11~BSLe14 are enabled at the same time or the bitline selection signals BSLo11~BSLo14 are enabled at the same time. For instance, when the bitline selection signals BSLe11~BSLe14 are enabled at the same time, the program data bits PQ1~PQ4 are each transferred to the bitlines BLe11~BLe14. As a result, the program data bits PQ1~PQ4 are programmed in memory cells connected to the bitlines BLe11~BLe14.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

As aforementioned, by the present invention, since memory cells connected each to pluralities of bitline pairs are able to be accessed by a single page buffer circuit and a single Y-gate circuit, it is possible to reduce the number of the Y-gate circuits and thereby to shrink down the size of the flash memory device.

What is claimed is:
1. A flash memory device comprising:
   a memory cell array including memory cells connected to pluralities of bitlines;

page buffer circuits correspondingly connected to bitline pairs with a predetermined number among the plural bitlines, sequentially storing sensing data bits corresponding to read data bits received through at least a portion of the bitline pairs with the predetermined number in response to one of transfer control signals and a latch control signal during a read operation, and sequentially outputting the stored data bits to one of internal input/output lines in response to one of the transfer control signals;

Y-gate circuits correspondingly connected to the page buffers through the internal input/output lines, each connecting or disconnecting one of the internal input/output lines with a data input/output line in response to one of input/output control signals; and a Y-decoder generating the transfer control signals and the input/output control signals in response to column address signals, a read command or a program command.

2. The flash memory device as set forth in claim 1, wherein each of the page buffer circuits is coupled to two bitline pairs at least.

3. The flash memory device as set forth in claim 1, wherein each of the page buffer circuits sequentially stores program data bits received in sequence through one of the internal input/output lines in response to one of the transfer control signals during a program operation, and simultaneously outputs the stored data bits to at least a portion of the bitline pairs with the predetermined number in response to a program control signal.

4. The flash memory device as set forth in claim 3, wherein each of the transfer control signals includes bits with the predetermined number.

5. The flash memory device as set forth in claim 4, wherein the Y-decoder generates the input/output control signals with reference to the bits of the transfer control signals.

6. The flash memory device as set forth in claim 4, wherein the Y-decoder comprises:

a transfer control circuit outputting the transfer control signals and enable control signals in response to a read command and a program command; and input/output control circuits configured to be enabled or disabled in response to the enable control signals, each outputting one of the input/output control signals in response to one of the transfer control signals and one of the column address signals.

7. The flash memory device as set forth in claim 6, wherein each of the page buffer circuits comprises:

bitline selection circuits each provided between first sensing nodes and the bitline pairs with the predetermined number, the bitline selection circuits being configured to connect the bitline pairs to the first sensing nodes in response to the bitline selection signals;

a precharge circuit to precharge a second sensing node to a predetermined voltage level in response to a precharge control signal;

first switches provided between the first sensing nodes and the second node, coupling the first sensing nodes to the second sensing node at the same time in response to a read control signal;

a sensing circuit configured to be enabled in response to the latch control signal during the read operation and sense a voltage of the second sensing node that continuously varies by the read data bits and generate the sensing data bits;

latch circuits with the predetermined number and configured to latch the sensing data bits or the program data bits;

pass circuits to share a corresponding one of the internal input/output lines, each pass circuit coupled to the latch circuits with the predetermined number and correspondingly connect or disconnect the latch circuits to the internal input/output line in response to bits of the transfer control signal; and second switches provided between the latch circuits and the first sensing nodes and configured to simultaneously connect or disconnect the latch circuits to the first sensing nodes in response to the program control signal.

8. The flash memory device as set forth in claim 7, wherein the transfer control circuit maintains the enable control signals in an inactive state for a first predetermined time, maintains a first one of bits of the transfer control signal on a first logic value for a second predetermined time, changes the rest bits of the transfer control signal into the first logic value for a third predetermined time, and maintains the bits of the transfer control signal all in the second logic value when the page buffer circuits each stores the last bits among the sensing data bits; and wherein the page buffer circuits each stores the sensing data bits in sequence for the first predetermined time.

9. The flash memory device as set forth in claim 8, wherein the transfer control circuit activates the enable control signals one by one in sequence for a fourth predetermined time after the page buffer circuits store the last sensing data bits, and changes the bits of the transfer control signals one by one in sequence for the third predetermined time whenever one of the enable control signals is activated; and wherein one of the page buffer circuits outputs the sensing data bits to one of the internal input/output lines in sequence for the fourth predetermined time.

10. The flash memory device as set forth in claim 9, wherein a first pass circuit of the pass circuits couples a first latch circuit of the latch circuits to a corresponding one of the internal input/output lines when the first bit becomes the first logic value;

wherein the first latch circuit sequentially latches the sensing data bits received from the sensing circuit and then outputs the latched data bits to the corresponding internal input/output line while being coupled to the corresponding internal input/output line by the first pass circuit, and latches the last sensing data bit while being isolated from the corresponding internal input/output line by the first pass circuit;

wherein the pass latch circuits other than the first pass circuit each couples one of the latch circuits to corresponding one of internal input/output lines when the a corresponding rest bit change to the first logic value; and wherein the rest latch circuits other than the first latch circuit each latches the latched sensing data bits received from the first latch circuit through the internal input/output line.

11. The flash memory device as set forth in claim 10, wherein the pass circuits couple the latch circuits to the corresponding internal input/output line one by one in sequence when the corresponding bits of the transfer control signal are changed to the first logic value one by one in sequence; and wherein the latch circuits output the latched data bits to the internal input/output line while being coupled to the internal input/output line.

12. The flash memory device as set forth in claim 9, wherein the input/output control circuits are each enabled when the enable control signals are each activated, and each enables the enable control signals when one of bits of the transfer control signals is the first logic value; and wherein one of the Y-gate circuits couples one of the internal input/output lines to the data input/output line when one of the input/output control signals is enabled.

13. The flash memory device as set forth in claim 7, wherein the transfer control circuit activates the enable control signals one by one in sequence for a first predetermined time in response to the program command, and changes one bits of the transfer control signals into a first logic value one by one in sequence for a second predetermined time shorter than the first predetermined time whenever one of the enable control signals is activated; and wherein one of the page buffer circuits stores the program data bits in sequence for the first predetermined time.

14. The flash memory device as set forth in claim 13, wherein the transfer control circuit maintains bits of the transfer control signals all in a second logic value, after the page buffer circuits store all the program data bits, and maintains the enable control signals all in an inactive state.

15. The flash memory device as set forth in claim 14, wherein the pass circuits couple the latch circuits to the internal input/output line when the corresponding bits of the transfer control signal are changed into the first logic value one by one in sequence; and wherein the latch circuits each latch the program data bits while being couple to the internal input/output line.

16. The flash memory device as set forth in claim 14, wherein the input/output control circuits are each enabled when the enable control signals are each activated, and each enable the input/output control signals when the bits of the transfer control signals are each the first logic value; and wherein each of the Y-gate circuits couples one of the internal input/output lines to the data input/output line when a corresponding the input/output control signal is an enable signal.

17. The flash memory device as set forth in claim 16 wherein each of the input/output control circuit comprises:
a first logic circuit to output logic signals in response to one of the column address signals; and
a second logic circuit to output one of the input/output control signals in response to one bit of the transfer control signals, one of the enable control signals, and the logic signals.

18. A method for controlling a read operation of a flash memory device, the method comprising:
sequentially storing sensing data bits, corresponding to read data bits received through part of bitline pairs with a predetermined number, into page buffer circuits correspondingly coupled to bitlines with the predetermined number, in response to a read command;
isolating internal input/output lines from data input/output lines by Y-gate circuits each coupled to page buffer circuits through the internal input/output lines while storing the sensing data bits each in the page buffer circuits;
coupling the internal input/output lines to the data input/output line one by one in sequence by the Y-gate circuits after storing the sensing data bits each into the page buffer circuits; and
outputting the sensing data bits, which are stored in one of the page buffer circuits, in sequence to the internal input/output line coupled to the data input/output line whenever the internal input/output lines are each coupled to the data input/output line.

19. The method as set forth in claim 18, which further comprises:
generating transfer control signals and input/output control signals in response to the read command,
wherein the page buffer circuits are controlled by the transfer control signals and the Y-gate circuits are each controlled by the input/output control signals; and
wherein in the step of generating, the input/output control signals are each generated with reference to values of bits of each of the transfer control signals.

20. A method for controlling a program operation of a flash memory device, the method comprising:
coupling internal input/output lines to a data input/output line one by one in sequence for a predetermined time, in response to a program command, by Y-gate circuits coupled to page buffer circuits through the internal input/output lines, the page buffer circuits each coupled to bitline pairs with a predetermined number;
sequentially storing program data bits into one of the page buffer circuits whenever one of the internal input/output lines is connected to the data input/output line;
isolating internal input/output lines from data input/output lines by the Y-gate circuits while storing the sensing data bits in the page buffer circuits; and
simultaneously outputting the program data bits, which are each stored in the page buffer circuits, to part of the bitline pairs with the predetermined number, after the isolation.

21. The method as set forth in claim 20, further comprising:
generating transfer control signals and input/output control signals in response to the program command,
wherein the page buffer circuits are controlled by the transfer control signals and the Y-gate circuits are each controlled by the input/output control signals; and
wherein in the step of generating, the input/output control signals are each generated with reference to values of bits of each of the transfer control signals.

* * * * *